United States Patent [19]

Otani

[11] Patent Number: 4,696,057

[45] Date of Patent: Sep. 22, 1987

[54] CN RATIO MEASUREMENT CIRCUIT

[75] Inventor: Susumu Otani, Tokyo, Japan

[73] Assignee: NEC Corporation, Japan

[21] Appl. No.: 787,422

[22] Filed: Oct. 15, 1985

[30] Foreign Application Priority Data

Oct. 16, 1984 [JP] Japan .................................. 59-217047

[51] Int. Cl.[4] ............................................. H04B 17/00
[52] U.S. Cl. ................................. 455/226; 324/57 N;
455/304; 370/97
[58] Field of Search ......................... 455/226, 304, 67;
324/57 N; 370/97, 100

[56] References Cited

U.S. PATENT DOCUMENTS

| 3,350,643 | 10/1967 | Webb | 324/57 N |
| 4,107,608 | 8/1978 | Saburi | 370/97 |
| 4,553,086 | 11/1985 | Watanabe et al. | 324/57 N |

OTHER PUBLICATIONS

P. Hetrakul, "The Effect of Satellite Transponder Nonlinearities on the Performance of Binary PSK Systems" (49-55).

Primary Examiner—Jin F. Ng
Attorney, Agent, or Firm—Ostrolenk, Faber, Gerb & Soffen

[57] ABSTRACT

In a time division multiple access communication system including a nonlinear signal processing element, an accurate carrier power-to-noise ratio is obtained by the circuit of the present invention. In the inventive circuit, noise power is determined solely by the quadrature noise and, hence, is free from measurement errors caused by the compression of in-phase noise associated with a non-linear element in the transmission channel.

1 Claim, 6 Drawing Figures

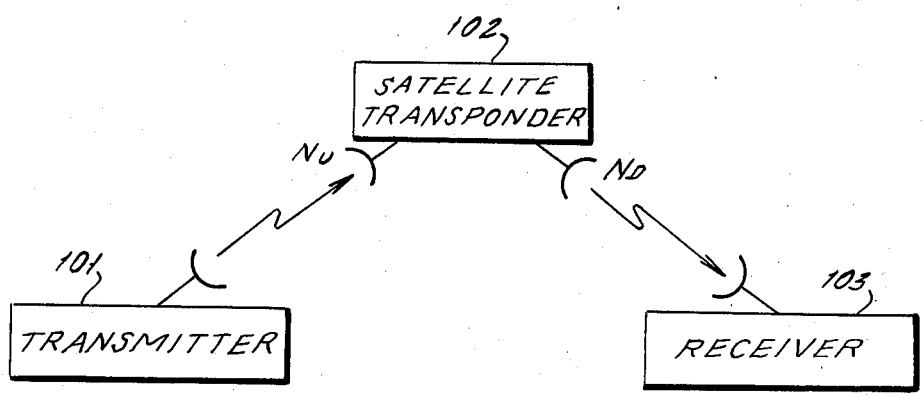
FIG. 1.
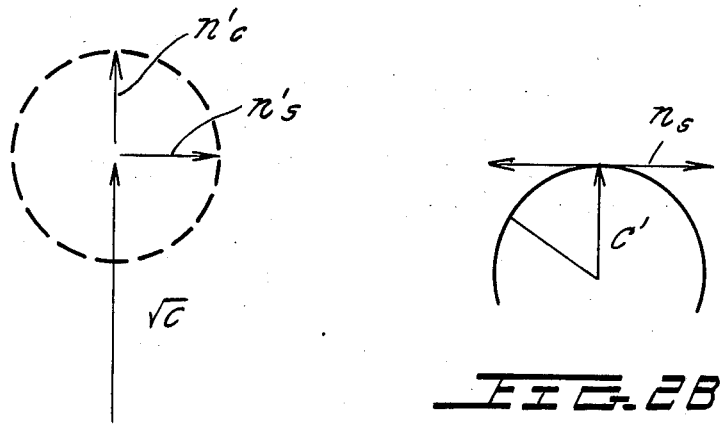
FIG. 2A.
FIG. 2B.

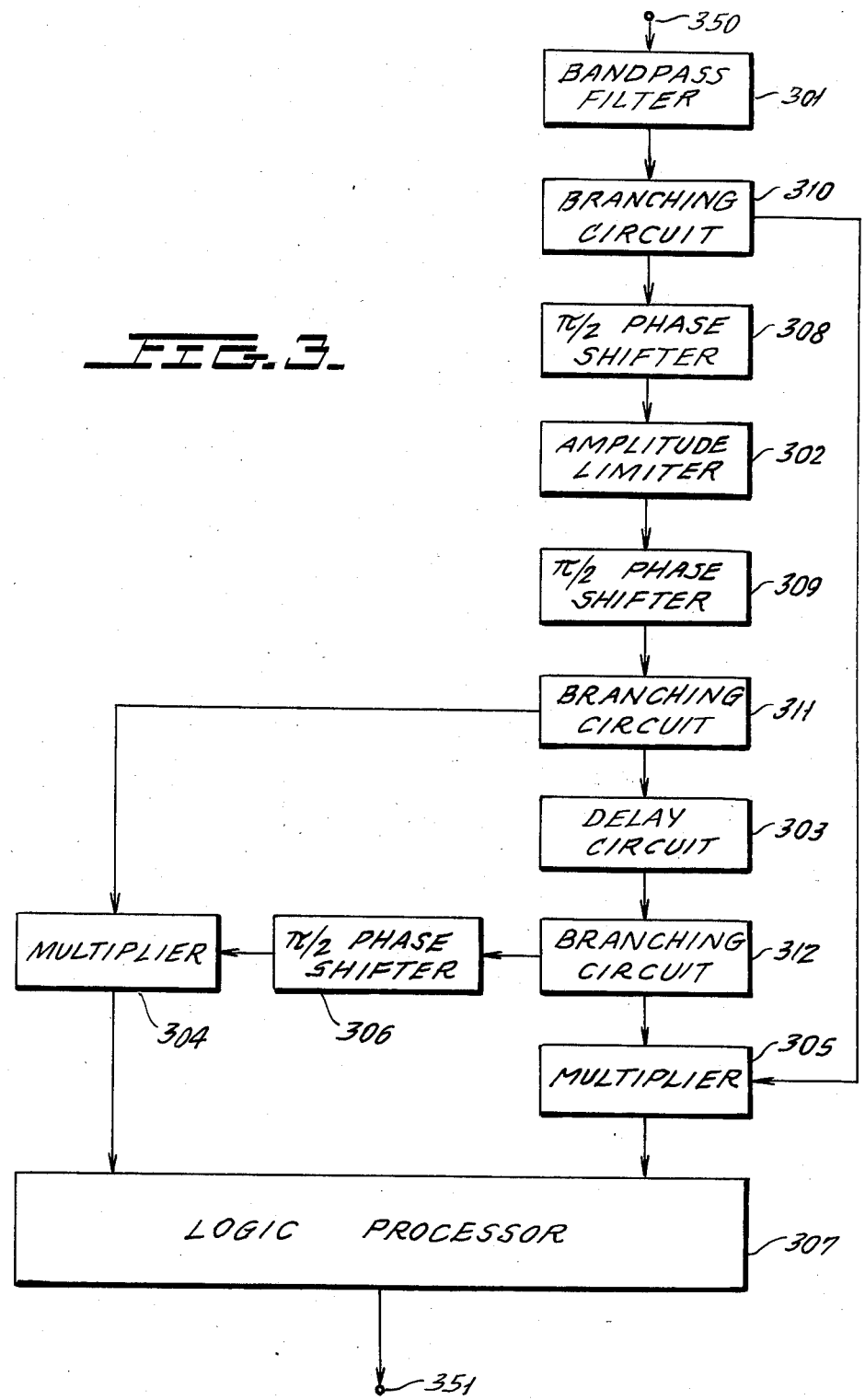

4,696,057

CN RATIO MEASUREMENT CIRCUIT

BACKGROUND OF THE INVENTION

The present invention generally relates to a time division multiple access (TDMA) communication system and, more particularly, to a circuit for measuring carrier power to noise power ratio in a TDMA transmission channel in which a nonlinear signal processing element exists.

With the progress of digital communications technology, TDMA communication systems utilizing satellites have come to be extensively used. Constant monitoring of the quality of a communication channel is of primary concern from the standpoint of channel maintenance and channel quality. The carrier power to noise ratio is one of the items to be monitored for the above purpose and has heretofore been measured in the prior art by measuring carrier power and noise power with a power meter.

The problem with the prior art method which relies on the power meter as stated above is that a true CN ratio cannot be measured due to nonlinearity of characteristics which is particular to a satellite transponder, as will be described later in detail.

SUMMARY OF THE INVENTION

It is, therefore, an object of the present invention to provide a CN ratio measurement circuit which is capable of measuring an accurate CN ratio even if a nonlinear signal processing element is present in a transmission channel.

In accordance with the invention, a CN ratio measurement circuit includes a bandpass filter for band-limiting an input signal, a first branching circuit for branching an output of the bandpass filter to produce two outputs, a first $\pi/2$ phase shifter for rotating a phase of one of the two outputs of the first branching circuit by $\pi/2$ radians, and an amplitude-limiter for limiting an amplitude of an output of the first $\pi/2$ phase shifter, a second $\pi/2$ phase shifter for rotating a phase of an output of the amplitude-limiter by another $\pi/2$ radians. The CN ratio measurement circuit further includes a second branching circuit for branching an output of the second $\pi/2$ phase shifter to produce two outputs, a delay circuit for delaying one of the two outputs of the second branching circuit, a third branching circuit for branching an output of the delay circuit to produce two outputs, a first multiplier for producing a product of one of the two outputs of the third branching circuit and the other output of the first branching circuit, a third $\pi/2$ phase shifter for rotating a phase of the other output of the third branching circuit by $\pi/2$ radians, a second multiplier for producing a product of an output of the third $\pi/2$ phase shifter and the other output of the second branching circuit. The CN measurement circuit also includes a first averaging circuit for averaging an output of the first multiplier, a first squaring circuit for producing a square of an output of the first averaging circuit, a second squaring circuit for producing a square of an output of the second multiplier, a second averaging circuit for averaging an output of the second squaring circuit, a divider for dividing an output of the first squaring circuit by an output of the second averaging circuit, and a constant circuit for multiplying an output of the divider by a predetermined constant.

BRIEF DESCRIPTION OF THE DRAWINGS

FIG. 1 is a block diagram modelling a satellite communication system;

FIGS. 2A and 2B are diagrams demonstrating an occurrence that when in-phase noise and quadrature noise associated with a signal are passed through a nonlinear element, the in-phase noise is removed by the nonlinear element;

FIG. 3 is a block diagram of a CN measurement circuit embodying the present invention;

DETAILED DESCRIPTION OF THE INVENTION

Figure 4:
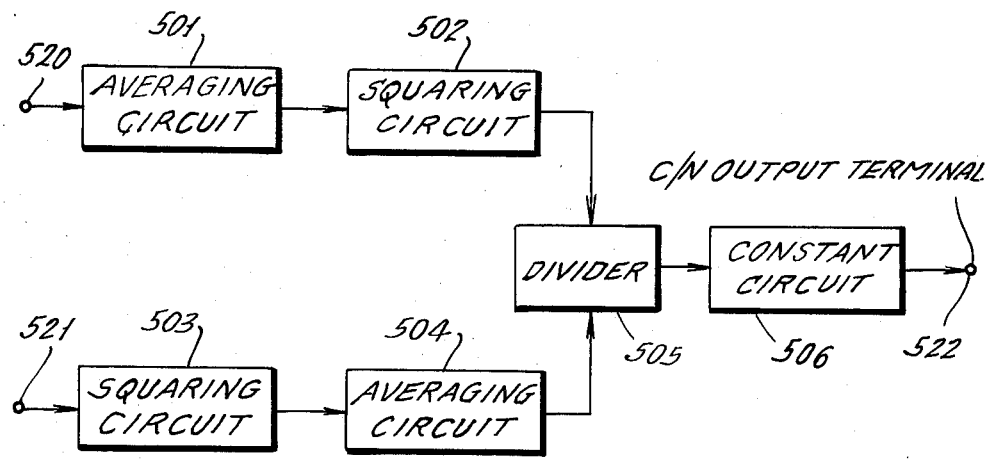
FIG. 4 is a block diagram showing in detail a logic processor which is included in the circuit of FIG. 3.

To better understand the present invention, a brief explanation will be made on received signal power and channel noise with reference to FIG. 1, which models a satellite communication system. In FIG. 1, the reference numeral 101 designates a transmit earth station, 102 a satellite transponder, and 103 a receive earth station. Up-link noise is represented by $N_U$ and down-link noise by $N_D$.

Assuming that the received signal power at the input point of the receiver 103 is C, the true CN ratio should be $C/(N_U+N_D)$.

However, the satellite transponder 102 is generally implemented by a nonlinear element, perfect limiters being used with some communications satellites. A major problem that results is that it is impossible to measure the up-link noise $N_U$ from an output of such a nonlinear element using a wattmeter. To demonstrate this, reference is made to FIGS. 2A and 2B.

As shown in FIG. 2A, input noise power $N_U$ is defined by in-phase noise $n'_c(t)$ and quadrature noise $n'_s(t)$ as $\overline{n'^2_c(t)} + \overline{n'^2_s(t)}$, where $(\overline{\phantom{-}})^2$ indicates a mean square. As shown in FIG. 2B, the in-phase noise $n'_c$ is removed by the nonlinear element and does not appear in an output of the element, that is, only $\overline{n'^2_s(t)}$ appears. For this reason, the prior art wattmeter scheme for CN ratio measurement fails to provide an accurate CN ratio when a nonlinear element is present in the transmission channel.

Referring to FIG. 3, a CN measurement circuit embodying the present invention is shown in a block diagram. As shown, the CN measurement circuit comprises a bandpass filter 301, an amplitude-limiter 302, a delay circuit 303 for providing a delay time T, multipliers 304 and 305, $\pi/2$ phase shifters 306, 308 and 309, a logic processor 307, branching circuits 310, 311 and 312, a signal input terminal 350, and a CN output terminal 351.

The operation of the CN measurement circuit having the above construction will be described with reference to FIG. 3.

The signal coming in through the input terminal 350 as shown in FIG. 3 is the sum of a signal s(t) and noise ni(t). Measurement of a CN ratio is generally performed during an unmodulated period such as the period of a word which precedes a TDMA burst signal for synchronization purpose, which will be described. With this in mind, the operation of the circuit of FIG. 3 will be described during an unmodulated portion in which $s(t)$ is $\sqrt{2P} \cos \omega_o t$, where P is a signal envelope and $\omega_o$, an angular frequency of a signal.

The input signal propagates through the bandpass filter 301 whose center frequency is $\omega_o/2\pi$. Assuming that the power density of $n_i(t)$ is No (W/Hz) and that the filter band is B, then noise $n(t)$ in the filter output may be expressed as $$n(t) = n_c(t) \cos \omega_o t + n_s(t) \sin \omega_o t \quad \text{Eq. (1)}$$

where $\overline{2n_c^2(t)} = \overline{2n_s^2(t)} = BNo$.

Therefore, the composite signal $r(t)$ of noise and signal is represented by:

$$r(t) = (\sqrt{2} P + n_c(t)) \cos \omega_o t + n_s(t) \sin \omega_o t \quad \text{Eq. (2)}$$

Assuming that a signal prepared by subjecting the composite signal to $\pi/2$ radians of phase rotation by means of the $\pi/2$ phase shifte 308 is $r^*(t)$; then, $$r(t) = n_s(t) \cos \omega_o t - [\sqrt{2} P + n_c(t)] \sin \omega_o t =$$

$$\sqrt{n_s^2(t) + (\sqrt{2} P + n_c(t))^2} \cdot$$

$$\sin\left(\omega_o t + \tan^{-1} \frac{n_s(t)}{-\sqrt{2} P + n_c(t)}\right)$$

By passing this signal through the amplitude limiter 302, there is obtained a signal $\widehat{r^*}(t)$ which is:

$$\widehat{r^*}(t) = \sqrt{2} A \sin\left(\omega_o t + \tan^{-1} \frac{n_s(t)}{-(\sqrt{2} P + n_c(t))}\right) \approx$$

$$2 A \sin \omega_o t + \sqrt{2} A \cdot \frac{n_s(t)}{-\{\sqrt{2} P + n_c(t)\}} \cos \omega_o t \cdot$$

$$\left| \frac{n_s(t)}{\sqrt{2} P + n_c(t)} \right| < 1$$

The resulting signal is again subjected to $\pi/2$ radians of phase rotation by the $\pi/2$ phase shifter 309 to develop a signal $\widehat{r}(t)$ which is represented by:

$$\widehat{r}(t) = \sqrt{2} A \cos \omega_o t + n'_s(t) \sin \omega_o t \quad \text{Eq. (3)}$$

where $$n'_s(t) = \frac{\sqrt{2} A \cdot n_s(t)}{-\{\sqrt{2} P + n_c(t)\}}$$

in which A represents an amplitude limiter output level.

When the signal represented by the Eq. (3) is passed through the delay circuit 303, the circuit 303 produces an output signal $r(t+T)$:

$$\widehat{r}(t + T) = \sqrt{2} A \cos \omega_o t + n'_s(t + T) \sin \omega_o t \quad \text{Eq. (4)}$$

where T is selected so as to provide $\omega_o T = O \pmod{2\pi}$.

Since the output $Dp(t)$ of the multiplier 305 is the product of the Eqs. (2) and (4), $$Dp(t) = r(t) \times r(t + T)$$

$$= [(\sqrt{2} P + n_c(t)) \cos \omega_o t + n_s(t) \sin \omega_o t] \times$$

$$[\sqrt{2} A \cos \omega_o t + n'_s(t + T) \sin \omega_o t]$$

Assuming that the multiplier 305 serves to remove the $2\omega_o$ component, then $$Dp(t) = PA + \frac{\sqrt{2}}{2} A n_c(t) + n_s(t) \cdot n'_s(t + T) \cdot \frac{1}{2} \quad \text{Eq. (5)}$$

Meanwhile, the output signal $Dq(t)$ of the multiplier 304 is the product of the signal represented by the Eq. (3) and a signal provided by phase-rotating by $\pi/2$ the signal represented by the Eq. (4) by the $\pi/2$ phase shifter 306. Hence, $$Dq(t) = \widehat{r}(t) \cdot \widehat{r^*}(t+T)$$

where "*" is indicative of 90 degrees phase rotation. Therefore, $$Dq(t) = [\sqrt{2} A \cos \omega_o t + n'_s(t) \sin \omega_o t] \times \quad \text{Eq. (6)}$$

$$[-n'_s(t + T) \cos \omega_o t + \sqrt{2} A \sin \omega_o t] =$$

$$-\frac{\sqrt{2}}{2} A n'_s(t + T) + \frac{\sqrt{2}}{2} A n'_s(t)$$

Referring to FIG. 4, details of the logic processor 307 are shown. As shown, the logic processor 307 is made up of an averaging circuit 501, squaring circuits 502 and 503, an averaging circuit 504, a divider 505, a constant circuit 506, input terminals 520 and 521, and an output terminal 522. The signal given by the Eq. (5) is applied to the input terminal 520. Then, the output $Dp(t)$ of the averaging circuit 501 is:

$$\overline{Dp(t)} = PA + \frac{\sqrt{2}}{2} An_c(t) + n_s(t) \cdot n'_s(t + T) \cdot \frac{1}{2}$$

Here, if $\overline{n_c(t)} = 0$ and T is so selected as to provide an equation $\overline{n_s(t) \cdot n'_s(t+T)} = \overline{n_s(t) \cdot n'_s(t+T)}$ (generally provided by $2/B \sim 3/B$), then:

$$\overline{Dp(t)} = PA \quad \text{Eq. (7)}$$

Therefore, the output signal of the squaring circuit 502 is:

$$\overline{Dp(t)} = PA^2 \quad \text{Eq. (8)}$$

On the other hand, the signal represented by Eq. (6) is applied to the input terminal 521. The resulting output of the squaring circuit 503 is:

$$Dq^2(t) = \tfrac{1}{2}\{An'_s(t+T)\}^2 + \tfrac{1}{2}(An'_s(t))^2 - An'_s(t+T)An'_s(t) \quad \text{Eq. (9)}$$

Further, the output of the averaging circuit 504 is:

$$\overline{Dq^2(t)} = \tfrac{1}{2}\,\overline{A^2}\;\overline{n'_s(t+T)^2} + \tfrac{1}{2}\,\overline{A^2}\;\overline{n'_s(t)^2}$$

$$-\overline{A\,n'_s(t+T)\,A\,n'_s(t)} = 0$$

Also, from $n'_s(t+T)^2 = n'_s(t)^2$ $$\overline{Dq^2(t)} = \tfrac{1}{2}\,\overline{A^2}\cdot 2\,\overline{n'_s{}^2(t)} \quad \text{Eq. (10)}$$

Since $$\overline{n'_s{}^2(t)} = \overline{\left(\frac{\sqrt{2}\,A\,n_s(t)}{-\{\sqrt{2}\,P + n_c(t)\}}\right)^2}$$

$$= 2\,\overline{A^2}\;\overline{n_s{}^2(t)}\cdot\frac{1}{(\sqrt{2}\,P + n_c(t))^2}$$

if $\sqrt{2}\,P >> n_c(t)$, then:

$$\overline{n'_s{}^2(t)} = \overline{A^2}\cdot\overline{n_s{}^2(t)}\cdot\frac{1}{P^2}$$

Further, since $2\overline{n_s{}^2(t)} = \overline{n_c{}^2(t)}$, there eventually holds:

$$\overline{Dq^2(t)} = \tfrac{1}{2}\,\overline{A^2}\cdot\frac{\overline{A^2}}{P^2}\cdot\overline{n^2(t)}$$

The divider 505 divides the output of the squaring circuit 502 by the output of the averaging circuit 504, producing an output:

$$\frac{\overline{P\,A^2}}{\tfrac{1}{2}\,\overline{A^2}\cdot\dfrac{\overline{A^2}}{P^2}\cdot\overline{n^2(t)}} = \frac{2P^2}{\overline{n^2(t)}}\cdot\frac{P^2}{\overline{A^2}}$$

In this instance, if the amplitude A of the amplitude limiter 302 is predetermined as $\overline{A^2} = P^2$ by an automatic gain control function or the like, then $2P^2/\overline{n^2(t)}$ will be outputted from the divider 505.

The constant circuit 506, assuming that the constant is $\tfrac{1}{2}$, produces an output signal which is:

$$\tfrac{1}{2}\cdot\frac{2P^2}{\overline{n(t)^2}} = \frac{P^2}{\overline{n(t)^2}}$$

Since $C = P^2$ and $N = \overline{n(t)^2}$, a CN ratio is obtained at the output terminal 522. Concerning the constant circuit 506, any desired constant may be selected depending upon the particular conditions of the display circuit (not shown) which receives the output of the constant circuit. What is notable here is that in the illustrative measurement system the noise power is determined solely by the quadrature noise $n_s(t)$ and, hence, it is free from the influence of measurement errors caused by the compression of in-phase noise which in turn is brought about by the non-linear element in the transmission channel.

Figure 5:
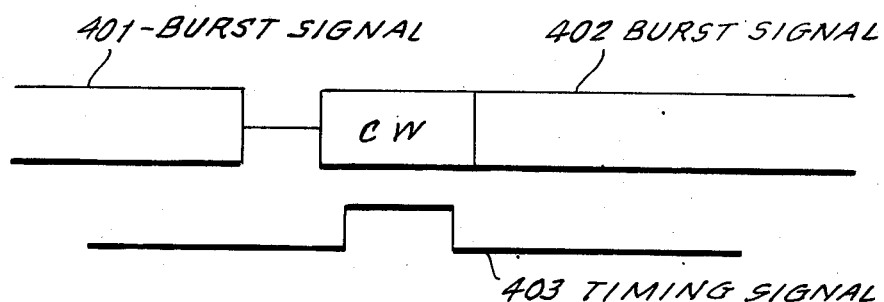
FIG. 5 is an exemplary timing chart representative of a case wherein an unmodulated portion is employed for measurement with the circuit of the present invention to be carried out in TDMA communication.

Referring to FIG. 5, TDMA burst signals 401 and 402 are shown in which are transmitted from TDMA earth stations. Generally, a burst signal precedes a preword burst which is adapted for demodulator synchronization, so that a demodulator may be rapidly synchronized.

A desirable example of the synchronizing preword is an unmodulation. CW in FIG. 5 represents an unmodulated signal. Since in a TDMA system the point of arrival of a received signal can be predicted, the circuit in accordance with the present invention is applicable to such a system by using a signal which occurs as indicated by the reference numeral 403 in FIG. 5.

In summary, it will be seen that the present invention provides a CN ratio measurement circuit which entails no error despite possible influence of a nonlinear element located in a transmission channel. This is because the present circuit measures noise power from only the noise which is orthogonal to a signal. Hence, even if a satellite transponder includes a nonlinear element, the TDMA communication system, even while the channel is in use, is capable of measuring an accurate CN ratio. This can be accomplished by furnishing a burst signal with an unmodulated portion and, sampling such unmodulated portions of burst signals to be measured.

Although the present invention has been described in connection with a plurality of preferred embodiments thereof, many other variations and modifications will become apparent to those skilled in the art. It is preferred, therefore, that the present invention be limited not by the specific disclosure herein, but only by the appended claims.

What is claimed is:

1. A circuit for measuring carrier power to noise power ratio in a communication transmission channel including a nonlinear signal processing element, comprising:
   a bandpass filter for band-limiting an input signal;
   a first branching circuit for branching an output of said bandpass filter to produce two outputs;
   a first $\pi/2$ phase shifter for rotating a phase of one of said two outputs of said first branching circuit by $\pi/2$ radians;
   an amplitude-limiter for limiting an amplitude of an output of said first $\pi/2$ phase shifter;
   a second $\pi/2$ phase shifter for rotating a phase of an output of said amplitude-limiter by another $\pi/2$ radians;
   a second branching circuit for branching an output of said second $\pi/2$ phase shifter to produce two outputs;
   a delay circuit for delaying one of said two outputs of said second branching circuit;
   a third branching circuit for branching an output of said delay circuit to produce two outputs;
   a first multiplier for producing a product of one of said two outputs of said third branching circuit and the other output of the first branching circuit;
   a third $\pi/2$ phase shifter for rotating a phase of the other output of the third branching circuit by $\pi/2$ radians;

a second multiplier for producing a product of an output of said third $\pi/2$ phase shifter and the other output of the second branching circuit;

a first averaging circuit for averaging an output of the first multiplier;

a first squaring circuit for producing a square of an output of said first averaging circuit;

a second squaring circuit for producing a square of an output of the second multiplier;

a second averaging circuit for averaging an output of said second squaring circuit;

a divider for dividing an output of the first squaring circuit by an output of said second averaging circuit; and a constant circuit for multiplying an output of said divider by a predetermined constant.

* * * * *